(12) United States Patent
Su

(10) Patent No.: US 10,127,169 B2
(45) Date of Patent: Nov. 13, 2018

(54) SUPPORTING FLOW CONTROL MECHANISM OF BUS BETWEEN SEMICONDUCTOR DIES ASSEMBLED IN WAFER-LEVEL PACKAGE

(71) Applicant: MEDIATEK INC., Hsin-Chu (TW)

(72) Inventor: Yao-Chun Su, Hsinchu (TW)

(73) Assignee: Nephos (Hefei) Co. Ltd., Hefei, Anhui (CN)

( * ) Notice: Subject to any disclaimer, the term of this patent is extended or adjusted under 35 U.S.C. 154(b) by 185 days.

(21) Appl. No.: 15/043,622

(22) Filed: Feb. 15, 2016

(65) Prior Publication Data

US 2016/0239446 A1 Aug. 18, 2016

Related U.S. Application Data

(60) Provisional application No. 62/117,086, filed on Feb. 17, 2015.

(51) Int. Cl.

| | |
|---|---|
| *G06F 13/16* | (2006.01) |
| *H01L 23/498* | (2006.01) |
| *G06F 13/368* | (2006.01) |
| *G06F 13/40* | (2006.01) |
| *H01L 25/065* | (2006.01) |

(52) U.S. Cl.
CPC ........ *G06F 13/368* (2013.01); *G06F 13/4068* (2013.01); *H01L 23/49811* (2013.01); *H01L 23/49838* (2013.01); *H01L 25/065* (2013.01); *H01L 2225/06506* (2013.01); *H01L 2225/06527* (2013.01)

(58) Field of Classification Search
CPC ............ G06F 21/10; G06F 2221/0737; G06F 2221/2101; G06F 2221/2135
USPC ......................................................... 710/110
See application file for complete search history.

(56) References Cited

U.S. PATENT DOCUMENTS

| | | | | |
|---|---|---|---|---|
| 4,912,633 | A | * 3/1990 | Schweizer | .......... G06F 13/4059 710/110 |
| 5,613,077 | A | * 3/1997 | Leung | ..................... G06F 11/10 257/E21.526 |
| 5,815,023 | A | 9/1998 | Webber | |
| 6,317,804 | B1 | 11/2001 | Levy | |
| 7,911,952 | B1 | * 3/2011 | Nygreen | ............... H04L 47/215 370/235 |
| 9,124,383 | B1 | 9/2015 | Frankel | |
| 9,287,208 | B1 | * 3/2016 | Khare | ................ H01L 23/5221 |
| 9,432,298 | B1 | 8/2016 | Smith | |
| 2002/0181455 | A1 | 12/2002 | Norman | |

(Continued)

FOREIGN PATENT DOCUMENTS

| | | |
|---|---|---|
| CN | 1547705 A | 11/2004 |
| CN | 101246465 A | 8/2008 |

(Continued)

*Primary Examiner* — Titus Wong
(74) *Attorney, Agent, or Firm* — Winston Hsu

(57) ABSTRACT

A semiconductor die assembled in a wafer-level package includes a communication interface and a bus master. The bus master is coupled to a communication bus through the communication interface. The bus master communicates with a bus slave of another semiconductor die assembled in the wafer-level package via the communication bus, and is controlled by a flow control mechanism that manages a transaction flow initiated by the bus master over the communication bus.

20 Claims, 4 Drawing Sheets

(56) References Cited

U.S. PATENT DOCUMENTS

| | | |
|---|---|---|
| 2003/0043790 A1* | 3/2003 | Gutierrez ............ G06F 15/7832 |
| | | 370/362 |
| 2005/0083217 A1 | 4/2005 | Kim |
| 2005/0094927 A1 | 5/2005 | Kish, Jr. |
| 2009/0077289 A1* | 3/2009 | Pagan .................... G06F 13/362 |
| | | 710/110 |
| 2009/0103345 A1 | 4/2009 | McLaren |
| 2010/0174936 A1* | 7/2010 | Hill .......................... G06F 1/10 |
| | | 713/500 |
| 2011/0202799 A1 | 8/2011 | Pagani |
| 2011/0208906 A1* | 8/2011 | Gillingham ........... G06F 1/3203 |
| | | 711/105 |
| 2012/0068360 A1* | 3/2012 | Best ..................... H01L 23/481 |
| | | 257/774 |
| 2013/0286614 A1 | 10/2013 | Tan |
| 2014/0192583 A1 | 7/2014 | Rajan |
| 2015/0185282 A1 | 7/2015 | Wang |

FOREIGN PATENT DOCUMENTS

| | | |
|---|---|---|
| CN | 101836257 A | 9/2010 |
| CN | 102184149 A | 9/2011 |
| EP | 0 866 404 A2 | 9/1998 |
| EP | 0866404 A2 | 9/1998 |
| EP | 0 866 404 A3 | 9/2002 |
| EP | 0866404 A3 | 9/2002 |

\* cited by examiner

… (1)

SUPPORTING FLOW CONTROL MECHANISM OF BUS BETWEEN SEMICONDUCTOR DIES ASSEMBLED IN WAFER-LEVEL PACKAGE

CROSS REFERENCE TO RELATED APPLICATIONS

This application claims the benefit of U.S. provisional application No. 62/117,086 (filed on Feb. 17, 2015). The entire content of the related application is incorporated herein by reference.

BACKGROUND

The present invention relates to a chip design, and more particularly, to a wafer-level package having semiconductor dies supporting a flow control mechanism for implementing a high performance bus protocol on a communication bus between the semiconductor dies.

When a chip function of a target chip is achieved using a large-sized die, the fabrication of large-sized dies on a wafer will suffer from low yield and high cost. Given the same die area, the yield of one large die is lower than the yield of multiple small dies. More specifically, assuming that distribution of defects on a wafer is the same, a die yield of one large-sized die fabricated on the wafer is lower than a die yield of multiple small-sized dies which have the same area fabricated on the same wafer. However, splitting one large die into multiple smaller dies may bring some overhead. For example, a large number of signals will be introduced to achieve communications between different small-sized dies assembled in the same package. Further, a communication bus between two small-sized dies may suffer from long latency. For example, when a real-time handshaking mechanism is employed by a bus master and a bus slave, the performance of the communication bus may be degraded due to the long latency inherent to the communication bus. Thus, there is a need for an innovative bus protocol design that can achieve a high performance communication bus between multiple dies assembled in the same package.

SUMMARY

One of the objectives of the claimed invention is to provide a wafer-level package having multiple semiconductor dies supporting a flow control mechanism for implementing a high performance bus protocol on a communication bus between the semiconductor dies.

According to a first aspect of the present invention, an exemplary semiconductor die assembled in a wafer-level package is disclosed. The exemplary semiconductor die includes a communication interface and a bus master. The bus master is coupled to a communication bus through the communication interface. The bus master is arranged to communicate with a bus slave of another semiconductor die assembled in the wafer-level package via the communication bus, and is further arranged to be controlled by a flow control mechanism that manages a transaction flow initiated by the bus master over the communication bus.

According to a second aspect of the present invention, an exemplary semiconductor die assembled in a wafer-level package is disclosed. The exemplary semiconductor die includes a communication interface and a bus slave. The bus slave is coupled to a communication bus through the communication interface. The bus slave is arranged to communicate with a bus master of another semiconductor die assembled in the wafer-level package via the communication bus, and is further arranged to trigger a flow control mechanism that manages a transaction flow initiated by the bus master over the communication bus.

According to a third aspect of the present invention, an exemplary wafer-level package is disclosed. The exemplary wafer-level package includes a communication bus and a semiconductor die. The semiconductor die includes a plurality of bus masters each arranged to be controlled by a flow control mechanism that manages a transaction flow over the communication bus, and further includes a bus arbiter arranged to perform arbitration upon transaction requests issued from the bus masters and grant an access right of the communication bus to only one of the bus masters at a time.

According to a fourth aspect of the present invention, an exemplary wafer-level package is disclosed. The exemplary wafer-level package includes a communication bus and a semiconductor die. The semiconductor die includes a plurality of bus slaves each arranged to trigger a flow control mechanism that manages a transaction flow over the communication bus, and further includes a bus dispatcher arranged to dispatch the transaction flow from the communication bus to at least one of the bus slaves at a time.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
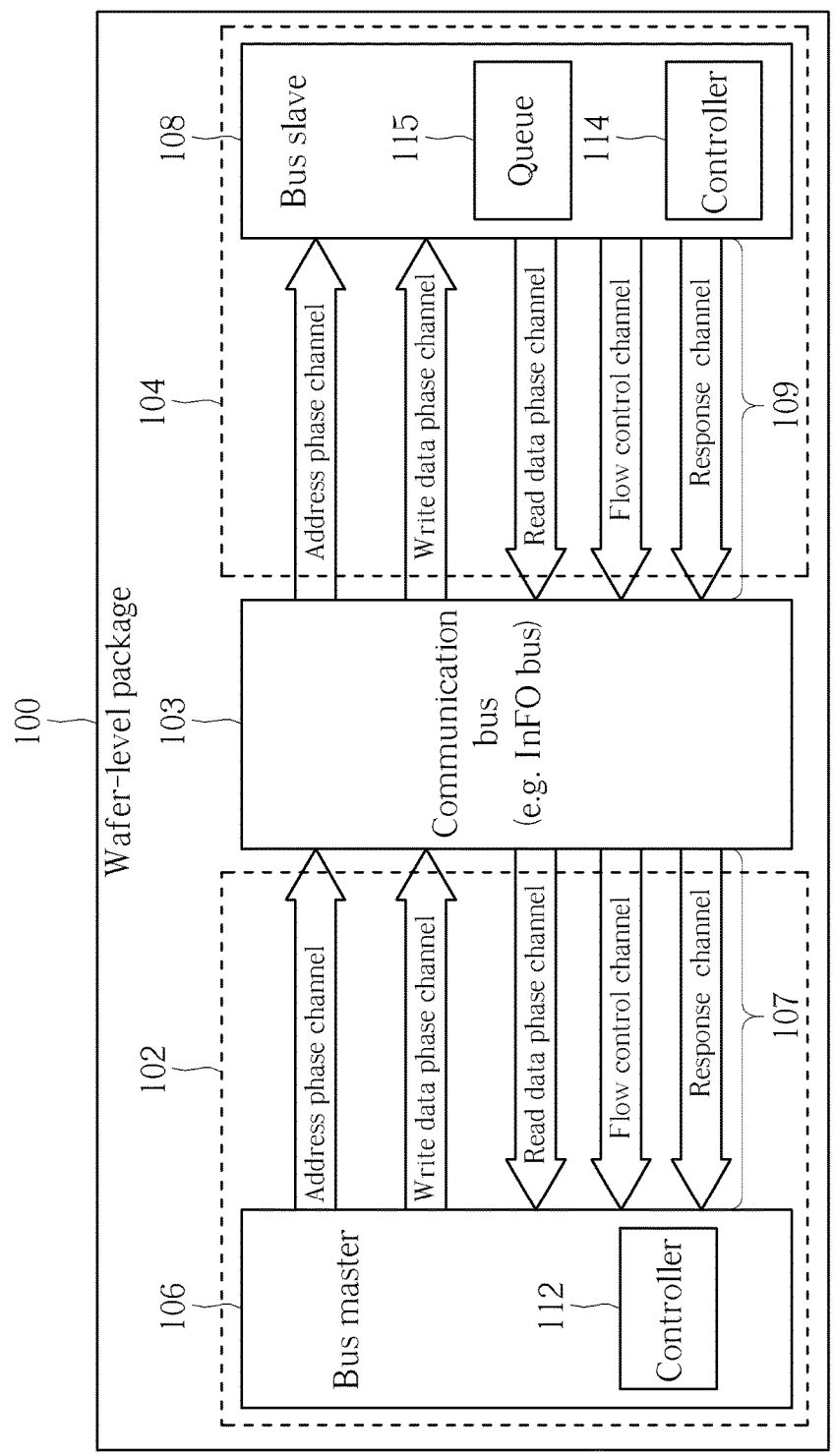
FIG. 1 is a diagram illustrating a wafer-level package according to an embodiment of the present invention.

FIG. 1 is a diagram illustrating a wafer-level package according to an embodiment of the present invention. In this embodiment, a single wafer-level package 100 has multiple semiconductor dies, such as two semiconductor dies 102 and 104, assembled therein. For example, the wafer-level package 100 is an integrated fan-out (InFO) package or a chip on wafer on substrate (CoWoS) package, the semiconductor dies 102 and 104 are homogeneous dies (i.e., identical dies) or heterogeneous die (i.e., distinct dies), and/or the semiconductor dies 102 and 104 are assembled in the wafer-level package 100 to perform a network switch function. However, this is for illustrative purposes only, and is not meant to be a limitation of the present invention.

Wafer-level packaging is the technology of packaging semiconductor dies, which is different from a typical packaging method of slicing a wafer into individual semiconductor dies and then packaging the individual semiconductor dies. The wafer-level package mentioned above is therefore fabricated based on wafer-level process. That is, multiple semiconductor dies (e.g., homogeneous dies or heterogeneous dies) assembled in the same wafer-level package and connection paths/communication buses/communication channels and so on routed between the semiconductor dies are fabricated with wafer-level process. Hence, connection paths, communication buses, or communication channels could be implemented by metal layer (such as RDL metal layer, Re-Distribution Layer, a metal layer on a die that makes the I/O pads of an integrated circuit available in other locations) rather than bonding wire of typical package.

Take InFO packages as examples for the following wafer-level packages (e.g., wafer-level packages 100 and 400), but not for a limitation. The wafer-level package used for the proposed flow control mechanism may be an InFO package or a CoWoS package, and "InFO bus" and "CoWoS bus" may be interchangeable.

The semiconductor die 102 of the wafer-level package 100 (e.g., InFO package) has a processing circuit (e.g., a bus master 106) and a communication interface (e.g., a bus interface) 107, where the bus master 106 is coupled to a communication bus 103 between the semiconductor dies 102 and 104 through the communication interface 107. The semiconductor die 104 of the wafer-level package 100 (e.g., InFO package) has a processing circuit (e.g., a bus slave 108) and a communication interface (e.g., a bus interface) 109, where the bus slave 108 is coupled to the communication bus 103 between the semiconductor dies 102 and 104 through the communication interface 109.

In a case where the wafer-level package 100 is an InFO package, the communication bus 103 is a high speed InFO bus. The bus master 106 located at one semiconductor die 102 is arranged to communicate with the bus slave 108 located at another semiconductor die 104 via the communication bus 103. In this embodiment, the bus master 106 has a controller 112 supporting a flow control mechanism, and the bus slave 108 has a controller 114 supporting the same flow control mechanism. Hence, the bus master 106 can be controlled by the flow control mechanism, and the bus slave 108 can trigger the flow control mechanism, where the flow control mechanism is used to manage a transaction flow initiated by the bus master 106 over the communication bus 103.

As shown in FIG. 1, each of the communication interfaces 107 and 109 includes an address phase channel, a write data phase channel, a read data phase channel, a response channel and a flow control channel, where each channel may include signal(s) transmitted via signal line (s) of the communication bus 103. The address phase channel may transmit read/write commands, read/write addresses, control information, etc. The write data phase channel may transmit write data to be written into the bus slave 108. The read data phase channel may transmit read data retrieved from the bus slave 108. The response channel may transmit execution results of read/write commands. The flow control channel may transmit a flow control signal from the bus slave 108 to the bus master 106.

In this embodiment, there is no conventional real-time handshaking performed between the bus master 106 and the bus slave 108, and the bus slave 108 has a queue 115 reserved for buffering command and data generated from the bus master 106. Further, the bus master 106 can support burst-based transaction (which allows consecutive read/write commands to be issued in a burst manner), multiple outstanding for read/write transaction (which allows new read/write commands to be issued before acknowledgment messages of previous read/write commands are received), a peer-to-peer master/slave scheme (which assigns one dedicated bus interface to one bus master), and/or atomic transaction (which ensures that read/write commands belonging to the same data access task are consecutively issued over the communication bus).

In addition, the bus slave 108 can support out-of-order transaction execution (which allows read/write commands orderly issued by different bus masters to be executed by the bus slave disorderly), and/or a peer-to-peer master/slave scheme (which assigns one dedicated bus interface to one bus slave). Moreover, to prevent the queue 115 from dropping pending command/data due to a limited storage capacity of the queue 115, a proposed flow control mechanism can be active to manage the transaction flow initiated by the bus master 106 over the communication bus (e.g., InFO bus) 103. In this way, a high performance management bus (particularly, a high bandwidth and latency insensitive management bus) can be provided through InFO technology.

In a first exemplary design, the flow control mechanism is implemented using a back-pressure mechanism configured to generate a back-pressure signal from the bus slave 108 to the bus master 106. As mentioned above, the queue 115 is used to buffer command and data included in the transaction flow initiated by the bus master 106 over the communication bus 103. The bus slave 108 can monitor a storage status of the queue 115 to determine if a predetermined criterion is satisfied.

For example, the bus slave 108 compares a size of a used space in the queue 115 with a predetermined threshold, and decides that the predetermined criterion is satisfied when the size of the used space in the queue 115 is larger than the predetermined threshold, where the predetermined threshold may be configured based on the actual latency of the communication bus (e.g., InFO bus) 103. For another example, the bus slave 108 compares a size of a free space in the queue 115 with a predetermined threshold, and decides that the predetermined criterion is satisfied when the size of the free space in the queue 115 is smaller than the predetermined threshold, where the predetermined threshold may be configured based on the actual latency of the communication bus (e.g., InFO bus) 103.

When the back-pressure signal is not asserted by the bus slave 108, the bus master 106 assumes that the bus slave 108 can accept all issued read/write transactions and the read/write transactions can be issued anytime. However, when the back-pressure signal is asserted by the bus slave 108, the bus master 106 is blocked from issuing new read/write transaction over the communication bus 103. Since the transaction flow over the communication bus 103 is paused, the used space in the queue 115 is not increased, and the bus slave 108 can process command and data buffered in the queue 115 to release at least a portion (i.e., part or all) of the used space in the queue 115. When the storage status of the queue 115 does not satisfy the predetermined criterion (e.g., the used space in the queue 115 is not larger than a predetermined threshold or the free space in the queue 115 is not smaller than a predetermined threshold), the bus slave 108 de-asserts the back-pressure signal, and the bus master 106 can resume transaction upon de-assertion of the back-pressure signal.

Figure 2:
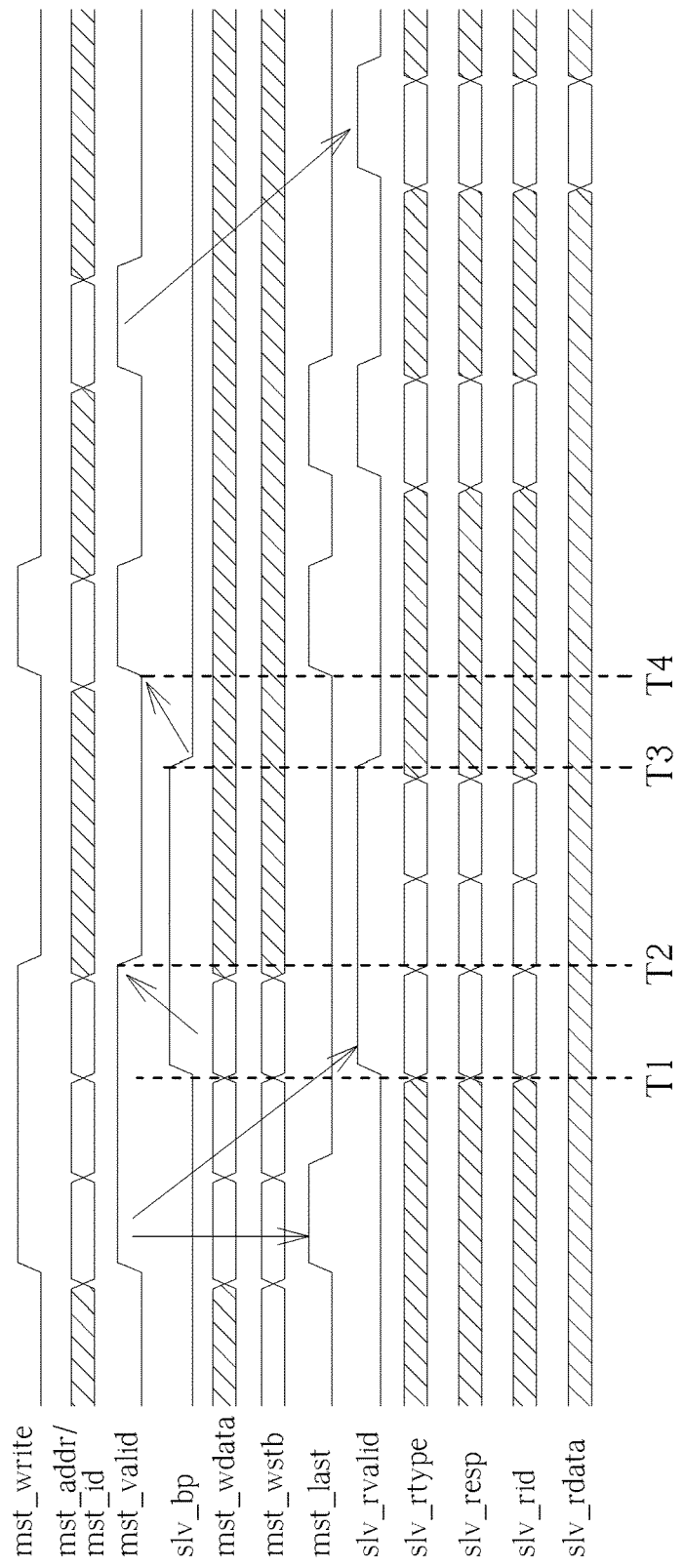
FIG. 2 is a timing diagram illustrating transaction between a bus master and a bus slave according to a first proposed bus protocol of the present invention.

FIG. 2 is a timing diagram illustrating transaction between a bus master and a bus slave according to a first proposed bus protocol of the present invention. The communication interfaces 107 and 109 complying with the first proposed bus protocol of the present invention may have a plurality of signals, including mst_write, mst_addr, mst_id, mst_valid, mst_wdata, mst_last, slv_bp, slv_rvalid, slv_rid, slv_resp, slv_rdata, etc. The signal mst_write generated from the bus master 106 indicates whether the transaction is a write transaction (mst_write=1) or a read transaction (mst_write=0). The signal mst_addr generated from the bus master 106 carries the read/write transaction target address. The signal mst_id generated from the bus master 106 carries an identifier (ID) of the bus master 106. The signal mst_valid generated from the bus master 106 indicates transaction valid (mst_valid=1) for notifying the bus slave 108 to latch data. The signal mst_wdata generated from the bus master 106 carries write transaction data when mst_write=1 and mst_valid=1. The signal mst_last generated from the bus master 106 indicates whether the current transaction is the last transaction of a group of consecutive transactions issued from the same bus master 106.

The signal slv_bp is a back-pressure signal generated from the bus slave 108. The signal slv_rvalid generated from the bus slave 108 indicates transaction response valid regardless of read/write transaction. The signal slv_resp generated from the bus slave 108 carries a transaction execution result (e.g., OK, FAIL, or other predefined value) when slv_rvalid=1. The signal slv_rid is used to support an out-of-order transaction execution, and the bus slave 108 returns a response by the signal slv_rid to indicate which transaction is executed. The signal slv_rdata generated from the bus slave 108 carries the read transaction data when slv_rvalid=1.

In accordance with the proposed bus protocol, the bus master 106 and the bus slave 108 can communicate with each other via a high performance management bus (particularly, high bandwidth and latency insensitive management bus) implemented using the communication bus (e.g., InFO bus) 103. The bus master 106 can do a burst transfer of any type of transaction whenever the signal mst_valid has back-to-back valid assertion. The bus master 106 can continue issuing new read/write transaction without waiting for the signal slv_resp that indicates the transaction execution result of previous read/write transaction, thus achieving multiple outstanding for read/write transaction. The bus master 106 can issue transaction with mst_id to enable out-of-order transaction execution at the bus slave 108. The bus slave 108 can use the signal slv_bp to pause any new read/write transaction issued from the bus master 106 to avoid dropping pending command/data. The bus master 106 can use the signal mst_last for enabling a bus arbiter to decide when to grant an access right of the communication bus 103 currently used by the bus master 106 to a different bus master. Hence, the signal mst_last can be used to support atomic transaction.

There are ground rules associated with signals of the communication interfaces 107 and 109. For example, one mst_valid=1 infers one slv_rvalid=1 with slv_resp. For another example, signals mst_write, mst_addr and mst_wdata are valid when mst_valid=1, and signals slv_resp and alv_rdata are valid when slv_rvalid=1. For yet another example, the signal slv_bp (i.e., back-pressure signal) can be valid/asserted anytime, and the bus master should stop issuing new read/write transaction upon detecting assertion of the signal slv_bp. As can be seen from FIG. 2, the bus slave 108 asserts the signal slv_bp at a time point T1 and de-asserts the signal slv_bp at a time point T3. After detecting assertion of the signal slv_bp, the bus master 106 de-asserts the signal mst_valid at a time point T2, such that issuing new read/write transaction is paused. After detecting de-assertion of the signal slv_bp, the bus master 106 asserts the signal mst_valid at a time point T4, such that issuing new read/write transaction is resumed.

The communication interface 107 of the semiconductor die 102 operates according to a first clock, and the communication interface 109 of the semiconductor die 102 operates according to a second clock. Ideally, the second clock should be synchronized with the first clock. However, due to certain factors, a phase shift may exist between the first clock and the second clock. Hence, when the phase shift exceeds a predetermined threshold, the bus master 106 may be instructed to pause the operation of issuing new read/write transaction over the communication bus 103 during a specific time period (e.g., one clock cycle), and a clock phase compensation procedure may be performed during the same specific time period. In other words, the back-pressure mechanism and the clock phase shift can instruct the bus master 106 to pause the operation of issuing new read/write transaction over the communication bus 103.

In a second exemplary design, the flow control mechanism is implemented using a credit-based flow control mechanism configured to manage credit of the bus master 106. When the credit of the bus master 106 fails to pass a predetermined criterion, the bus master 106 is blocked from issuing new read/write transaction over the communication bus 103. Initially, a default credit (e.g., credit=3) is advertised between the bus master 106 and the bus slave 108. The bus master 106 can issue new read/write transaction if the credit is enough. For example, if the credit of the bus master 106 is not a zero value, the credit of the bus master 106 can pass the predetermined criterion, and the bus master 106 is allowed to issue new read/write transaction to the bus slave 108.

In this embodiment, the bus master 106 updates the credit when issuing new read/write transaction over the communication bus 103. For example, when one new read/write transaction is issued from the bus master 106, the credit of the bus master 106 is updated by a decrement value (e.g., credit=credit−1). For another example, when more than one new read/write transaction is issued from the bus master 106, the credit of the bus master 106 is updated by a decrement value (e.g., credit=credit−N, where N>1).

Further, when one transaction issued from the bus master 106 has been executed by the bus slave 108, the bus slave 108 asserts a credit update signal transmitted to the bus master 106 via the communication bus 103. Hence, the bus master 106 updates the credit when receiving the credit update signal generated from the bus slave 108. For example, the credit of the bus master 106 is updated by an increment value (e.g., credit=credit+1) upon detecting assertion of the credit update signal. For another example, the credit of the bus master 106 is updated by an increment value (e.g., credit=credit+M, where M>1) upon detecting assertion of more than one credit update signal.

It is noted that in some embodiments, there could be a plurality of credit update signals, and the credit of the bus master 106 is updated by a decrement value or an increment value equal to or bigger than one corresponding to different designs.

To put it simply, the bus master consumes the credit each time one or more new read/write transaction(s) is issued to the bus slave 108, and the bus slave 108 returns the credit each time one or more transaction(s) issued from the bus master has been executed. Since the bus master is blocked from issuing new read/write transaction whenever the credit check fails, the transaction flow initiated from the bus master over the communication bus can be properly managed by the credit-based flow control mechanism to thereby prevent the queue 115 from dropping pending command/data due to a limited storage capacity of the queue 115.

Figure 3:
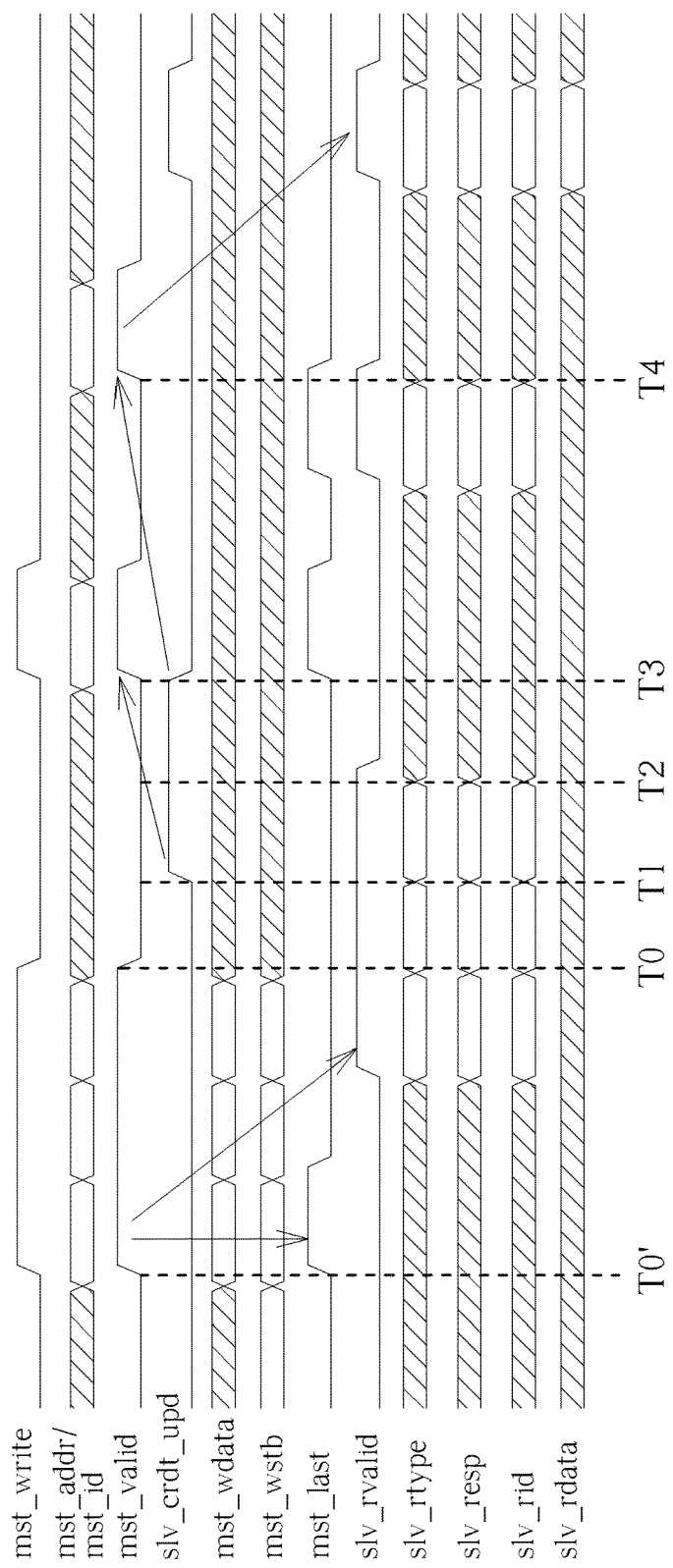
FIG. 3 is a timing diagram illustrating transaction between a bus master and a bus slave according to a second proposed bus protocol of the present invention.

FIG. 3 is a timing diagram illustrating transaction between a bus master and a bus slave according to a second proposed bus protocol of the present invention. The communication interfaces 107 and 109 complying with the second proposed bus protocol of the present invention may have a plurality of signals, including mst_write, mst_addr, mst_id, mst_valid, mst_wdata, mst_last, slv_crdt_upd, slv_rvalid, slv_rid, slv_resp, slv_rdata, etc. The major difference between the bus protocol designs shown in FIG. 2 and FIG. 3 is the signal slv_crdt_upd that takes the place of the signal slv_bp. The signal slv_crdt_upd is a credit update signal generated from the bus slave 108.

At a time point T0', the default credit is set by 3. Hence, after the bus master 106 issues 3 consecutive write transactions, the credit is decreased to a zero value at a time point T0. Hence, the signal mst_valid is de-asserted at the time point T0. After the first write transaction of the 3 consecutive write transactions issued from the bus master 106 has been executed by the bus slave 108, the bus slave 108 asserts the signal slv_crdt_upd at a time point T1. Upon detecting the assertion of the signal slv_crdt_upd at a time point T3, the credit is increased by one, and the bus master 106 asserts the signal mst_valid and then issues one write transaction. After one write transaction is issued, the credit is decreased by one to be a zero value, and the signal mst_valid is de-asserted accordingly.

Similarly, after the second write transaction of the 3 consecutive write transactions issued from the bus master 106 has been executed by the bus slave 108, the bus slave 108 asserts the signal slv_crdt_upd at a time point T2. Upon detecting the assertion of the signal slv_crdt_upd at a time point T4, the credit is increased by one, and the bus master 106 asserts the signal mst_valid and then issues one write transaction. After one write transaction is issued, the credit is decreased by one to be a zero value, and the signal mst_valid is de-asserted accordingly.

It is noted that in some embodiments, the signal slv_crdt_upd can be used to indicate multiple transactions between bus slave and bus master. For example, when multiple transactions are executed, bus slave returns the associated credit to bus master correspondingly, e.g. slv_crd_upd=1 means only one credit returned from bus slave; slv_crd_upd=2 means two credit returned from bus slave; slv_crd_upd=0 means no credit returned from bus slave (i.e. no transaction).

The communication interface 107 of the semiconductor die 102 operates according to a first clock, and the communication interface 109 of the semiconductor die 102 operates according to a second clock. Ideally, the second clock should be synchronized with the first clock. However, due to certain factors, a phase shift may exist between the first clock and the second clock. Hence, when the phase shift exceeds a predetermined threshold, the bus master 106 may be instructed to pause the operation of issuing new read/write transaction over the communication bus 103 during a specific time period (e.g., one clock cycle), and a clock phase compensation procedure may be performed during the same specific time period. In other words, the credit-based flow control mechanism and the clock phase shift can instruct the bus master 106 to pause the operation of issuing new read/write transaction over the communication bus 103.

In the embodiment shown in FIG. 1, the semiconductor die 102 is shown having one bus master 106, and the semiconductor die 104 is shown having one bus slave 108. However, this is for illustrative purposes only, and is not meant to be a limitation of the present invention. Alternatively, one semiconductor die may include more than one bus master, and another semiconductor die may include more than one bus slave. A high performance bus may require bus masters and bus slaves to support a peer-to-peer master/slave scheme. The present invention therefore proposes implementing a bus arbiter in one semiconductor die having multiple bus masters and implementing a bus dispatcher in one semiconductor die having multiple bus slaves.

Figure 4:
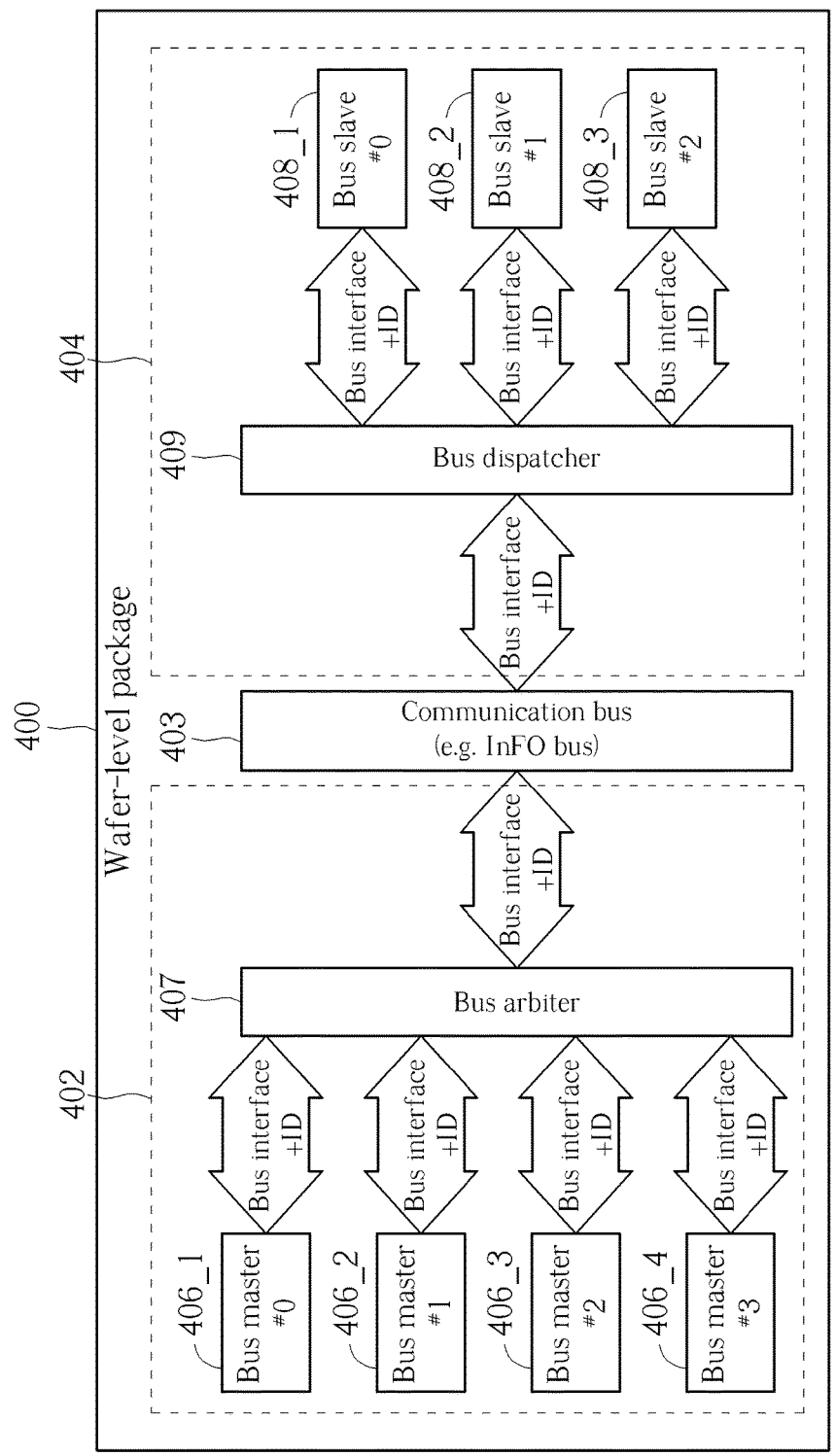
FIG. 4 is a diagram illustrating another wafer-level package according to an embodiment of the present invention.

FIG. 4 is a diagram illustrating another wafer-level package according to an embodiment of the present invention. In this embodiment, a single wafer-level package 400 has multiple semiconductor dies, such as two semiconductor dies 402 and 404, assembled therein. For example, the wafer-level package 400 is an integrated fan-out (InFO) package or a chip on wafer on substrate (CoWoS) package, the semiconductor dies 402 and 404 are homogeneous dies (i.e., identical dies) or heterogeneous dies (i.e., distinct dies), and/or the semiconductor dies 402 and 404 are assembled in the wafer-level package 400 to perform a network switch function. However, this is for illustrative purposes only, and is not meant to be a limitation of the present invention.

Since a wafer-level package using the proposed flow control mechanism and peer-to-peer master/slave scheme may be an InFO package or a CoWoS package, "InFO package" and "CoWoS package" may be interchangeable, and "InFO bus" and "CoWoS bus" may be interchangeable.

The semiconductor die 402 of the wafer-level package 400 (e.g., InFO package) has a plurality of processing circuits (e.g., bus maters 406_1, 406_2, 406_3, and 406_4) and a bus arbiter 407. The semiconductor die 404 of the wafer-level package 400 (e.g., InFO package) has a plurality of processing circuits (e.g., bus slaves 408_1, 408_2, and 408_3) and a bus dispatcher 409. In addition, there is a communication bus (e.g., InFO bus) 403 connected between the semiconductor dies 402 and 404 assembled in the same wafer-level package 400. It should be noted that the number of bus maters implemented in the same semiconductor die and the number of bus slaves implemented in the same semiconductor die can be adjusted, depending upon actual design consideration. Each of the bus maters 406_1-406_4 and each of the bus slaves 408_1-408_3 support the proposed bus protocol mentioned above. Hence, each of the bus maters 406_1-406_4 can be controlled by a flow control mechanism (e.g., back-pressure mechanism or credit-based flow control mechanism), and each of the slaves 408_1-408_3 can trigger the flow control mechanism (e.g., back-pressure mechanism or credit-based flow control mechanism), where the flow control mechanism (e.g., back-pressure mechanism or credit-based flow control mechanism) is employed to manage a transaction flow over the communication bus 403.

In this embodiment, the bus masters 406_1-406_4 and the bus slaves 408_1-408_3 support a peer-to-peer master/slave scheme. Hence, a bus interface between the bus arbiter 407 and one of the bus masters 406_1-406_4 is not shared with another of the bus masters 406_1-406_4, and a bus interface between the bus dispatcher 409 and one of the bus slaves 408_1-408_3 is not shared with another of the bus slaves 408_1-408_3. The bus arbiter 407 is connected to the bus masters 406_1-406_4 via separate bus interfaces, and performs arbitration upon transaction requests issued from the bus masters 406_1-406_4 and grant an access right of the communication bus 403 to only one of the bus masters 406_1-406_4 at a time. The bus dispatcher 409 is connected to the bus slaves 408_1-408_3 via separate bus interfaces, and dispatches the transaction flow from the communication bus 403 to only one of the bus slaves 408_1-408_3 at a time (i.e. unicast mode mode).

By way of example, but not limitation, an identifier (ID) of a selected bus master granted by the bus arbiter 407 to access the communication bus 403 is also transmitted to the bus dispatcher 409, and the bus dispatcher 409 can refer to the identifier (ID) of the selected bus master to decide which one of the bus slaves 408_1-408_3 should be selected for dealing with the transaction flow initiated from the selected bus master.

However, in other embodiments, when a transaction request issued from one of the bus masters 406_1-406_4 and arbitrated by the bus arbiter 407 is a multicast command or a broadcast command, the bus dispatcher 409 dispatches the transaction flow from the communication bus 403 to several (multicast mode) or all (broadcast mode) of the bus slaves 408_1-408_3 at a time according to the multicast/broadcast command or related identifier (ID) or address.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor die assembled in a wafer-level package, comprising:
   a communication interface;
   a bus master, coupled to a communication bus through the communication interface, wherein the bus master is arranged to communicate with a bus slave of another semiconductor die assembled in the wafer-level package via the communication bus, and is further arranged to be controlled by a flow control mechanism that manages a transaction flow initiated by the bus master over the communication bus; and
   a communication channel, for connecting the semiconductor die and the other semiconductor die, wherein the communication channel is a re-distribution layer (RDL) metal layer or a metal layer on the semiconductor dies.

2. The semiconductor die of claim 1, wherein the wafer-level package is an integrated fan-out (InFO) package.

3. The semiconductor die of claim 1, wherein the flow control mechanism is a back-pressure mechanism configured to generate a back-pressure signal from the bus slave to the bus master, and when the back-pressure signal is asserted, the bus master is blocked from issuing transaction over the communication bus.

4. The semiconductor die of claim 1, wherein the flow control mechanism is a credit-based flow control mechanism configured to manage credit of the bus master, and when the credit fails to pass a predetermined criterion, the bus master is blocked from issuing transaction over the communication bus.

5. The semiconductor die of claim 4, wherein the bus master is further arranged to update the credit when issuing new transaction over the communication bus.

6. The semiconductor die of claim 4, wherein the bus master is further arranged to update the credit when receiving a credit update signal generated from the bus slave.

7. The semiconductor die of claim 1, wherein the bus master is further arranged to support burst-based transactions.

8. The semiconductor die of claim 1, wherein the bus master is further arranged to support multiple outstanding read/write transactions.

9. The semiconductor die of claim 1, wherein the bus master is further arranged to support a peer-to-peer master/slave scheme.

10. The semiconductor die of claim 1, wherein the bus master is further arranged to support atomic transactions.

11. A semiconductor die assembled in a wafer-level package, comprising:
    a communication interface; and
    a bus slave, coupled to a communication bus through the communication interface, wherein the bus slave is arranged to communicate with a bus master of another semiconductor die assembled in the wafer-level package via the communication bus, and is further arranged to trigger a flow control mechanism that manages a transaction flow initiated by the bus master over the communication bus; and
    a communication channel, for connecting the semiconductor die and the other semiconductor die, wherein the communication channel is a re-distribution layer (RDL) metal layer or a metal layer on the semiconductor dies.

12. The semiconductor die of claim 11, wherein the wafer-level package is an integrated fan-out (InFO) package.

13. The semiconductor die of claim 11, wherein the bus slave comprises a queue arranged to buffer command and data included in the transaction flow initiated by the bus master over the communication bus; the flow control mechanism is a back-pressure mechanism; and the bus slave is arranged to trigger the back-pressure mechanism to assert a back-pressure signal transmitted to the bus master when a storage status of the queue satisfies a predetermined criterion.

14. The semiconductor die of claim 11, wherein the flow control mechanism is a credit-based flow control mechanism configured to manage credit of the bus master; and the bus slave is arranged to trigger the credit-based flow control mechanism to assert a credit update signal generated to the bus master over the communication bus when transaction issued from the bus master has been executed by the bus slave.

15. The semiconductor die of claim 11, wherein the bus slave is further arranged to support out-of-order transaction execution.

16. The semiconductor die of claim 11, wherein the bus slave is further arranged to support a peer-to-peer master/slave scheme.

17. A wafer-level package comprising:
    a communication bus;
    a semiconductor die, comprising:
       a plurality of bus masters, each arranged to be controlled by a flow control mechanism that manages a transaction flow over the communication bus; and
       a bus arbiter, arranged to perform arbitration upon transaction requests issued from the bus masters and grant an access right of the communication bus to only one of the bus masters at a time, wherein the semiconductor die communicates with another semiconductor die in the wafer-level package via the communication bus; and a communication channel, for connecting the semiconductor die and the other semiconductor die, wherein the communication channel is a re-distribution layer (RDL) metal layer or a metal layer on the semiconductor dies.

18. The wafer-level package of claim 17, wherein the wafer-level package is an integrated fan-out (InFO) package.

19. A wafer-level package comprising:
a communication bus;
a semiconductor die, comprising:
  a plurality of bus slaves, each arranged to trigger a flow control mechanism that manages a transaction flow over the communication bus; and
  a bus dispatcher, arranged to dispatch the transaction flow from the communication bus to at least one of the bus slaves at a time, wherein the semiconductor die communicates with another semiconductor die in the wafer-level package via the communication bus; and
a communication channel, for connecting the semiconductor die and the other semiconductor die, wherein the communication channel is a re-distribution layer (RDL) metal layer or a metal layer on the semiconductor dies.

20. The wafer-level package of claim 19, wherein the wafer-level package is an integrated fan-out (InFO) package.

* * * * *